United States Patent [19]

Tumpey et al.

[11] Patent Number: 5,313,098
[45] Date of Patent: May 17, 1994

[54] PACKAGING ARRANGEMENT FOR POWER SEMICONDUCTOR DEVICES

[75] Inventors: John J. Tumpey, Oakhurst; Raymond W. Borden, Farmingdale; Robert C. Eckenfelder, Point Pleasant; Sampat S. Shekhawat, Tinton Falls, all of N.J.

[73] Assignee: AlliedSignal Inc., Morris Township, Morris County, N.J.

[21] Appl. No.: 43,688

[22] Filed: Apr. 8, 1993

[51] Int. Cl.⁵ ................................................ H01L 25/04
[52] U.S. Cl. ........................................ 257/712; 257/714; 174/16.3
[58] Field of Search .................... 257/714, 708, 712; 174/16.3; 361/699, 703, 713

[56] References Cited

U.S. PATENT DOCUMENTS

| | | | |
|---|---|---|---|
| 4,009,423 | 2/1977 | Wilson | 257/714 |
| 5,111,280 | 5/1992 | Iversen | 257/714 |
| 5,168,348 | 12/1992 | Chu et al. | 257/714 |

Primary Examiner—Rolf Hille
Assistant Examiner—Roy Potter
Attorney, Agent, or Firm—Howard G. Massung

[57] ABSTRACT

A two-sided hermetically sealed package of a metal matrix composite material includes a heat sink and integral cooling fins on each of the two sides which are totally enclosed to retain cooling fluid. Power semiconductors are mounted on ceramic substrates having metallic conductors mounted on both sides thereof. The substrates are mounted to the heat sinks. Cooling is provided by the passage of cooling fluid into one end of the enclosed fins, over the fins and out the other end. The metal matrix composite material and the ceramic are thermally matched and the package is provided with a minimum number of thermal interfaces.

13 Claims, 3 Drawing Sheets

PACKAGING ARRANGEMENT FOR POWER SEMICONDUCTOR DEVICES

BACKGROUND OF THE INVENTION

This invention relates to packaging power semiconductor devices, whereby the size and weight of the package is reduced and the thermal efficiency thereof is increased.

The current trend toward very large scale integration of electronic components, greater current densities and high speed switching of power semiconductor devices has created the need to dissipate large heat build-ups. Due to higher aircraft coolant inlet temperatures specified for modern applications, prior art packaging arrangements for the purpose described have not been sufficient to enhance heat transfer characteristics essential for maintaining acceptable component temperatures, high reliability, light weight, high mean time between failures (MTBF) and lower life cycle cost.

The need for increased electrical power and improved range, particularly for military type aircraft, requires replacing prior art heavy, expensive and less efficient packaging materials and arrangements for power semiconductor devices with materials and arrangements more suitable for the intended purposes. Further, prior art packaging materials and arrangements have less than desireable heat transfer characteristics due to their relatively poor thermal conductivities. Also, mechanical failures occur as a result of mismatched thermal coefficients of expansion of the materials used.

Increased circuit density is also an important factor in designing packaging arrangements for power semiconductors. Through the use of effective packaging, circuit density is increased while package size and weight are reduced. Additionally, logic and low level analog circuitry can be cost effectively combined in the same package with the power semiconductors (chips).

The packaging arrangement for power semiconductor devices herein disclosed obviates the noted disadvantages of prior art packaging arrangements for the purposes intended, and is thus an improvement thereover.

SUMMARY OF THE INVENTION

This invention contemplates a packaging arrangement for power semiconductor devices including a unitary case having two sides, each of which has opposite surfaces. One of the opposite surfaces is configured as a walled heat sink and the other of said surfaces includes integral cooling fins. The cooling fins on the other surfaces of the two sides cooperate to provide a cooling fin arrangement. A plurality of substrates having conductors mounted thereto on both sides thereof are mounted to the heat sinks. The power semiconductor devices are electrically interconnected through said conductors. A cooling fluid input port is provided in the case, whereby cooling fluid enters one end of the fin arrangement, flows over the fins and exits the other end of the fin arrangement through an output port provided in the case. The sides of the case are covered by lids, whereby the case can be hermetically sealed. A hermetically sealed two-sided package for power semiconductor devices having an integral, finned heat sink totally enclosed for retaining cooling fluid is thus provided.

DETAILED DESCRIPTION OF THE INVENTION

Figure 1:
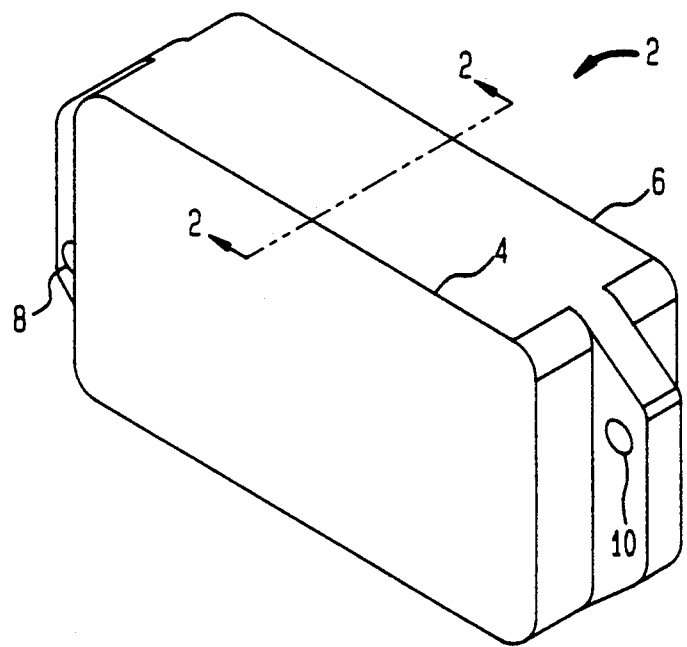
FIG. 1 is a perspective representation generally illustrating the invention.

With reference first to FIG. 1, the packaging arrangement for power semiconductor devices according to the invention includes a unitary case designated generally by the numeral 2. Case 2 is covered on opposite sides thereof by lids 4 and 6, for hermetically sealing the case. A cooling fluid inlet port is designated by the numeral 8 and a cooling fluid outlet port is designated by the numeral 10.

Figure 2:
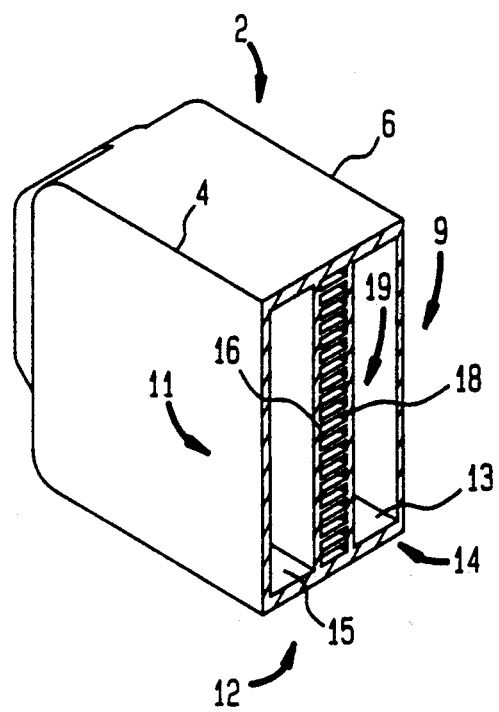
FIG. 2 is a sectional view taken along line 2—2 in FIG. 1.

With reference to FIG. 2, case 2 has two sides 9 and 11, each of which has integral fins 16 and 18, respectively. Sides 9 and 11 are joined to form unitary case 2, whereby integral fins 16 and 18 cooperate to form a fin arrangement 19. Sides 9 and 11 are configured to provide heat sinks 13 and 15, respectively, as will be hereinafter more fully discussed. Cooling fluid enters one end of fin arrangement 19 via inlet port 8 (FIG. 1), flows over the fin arrangement, and exits the other end thereof via outlet port 10 (FIG. 1).

Figure 3:
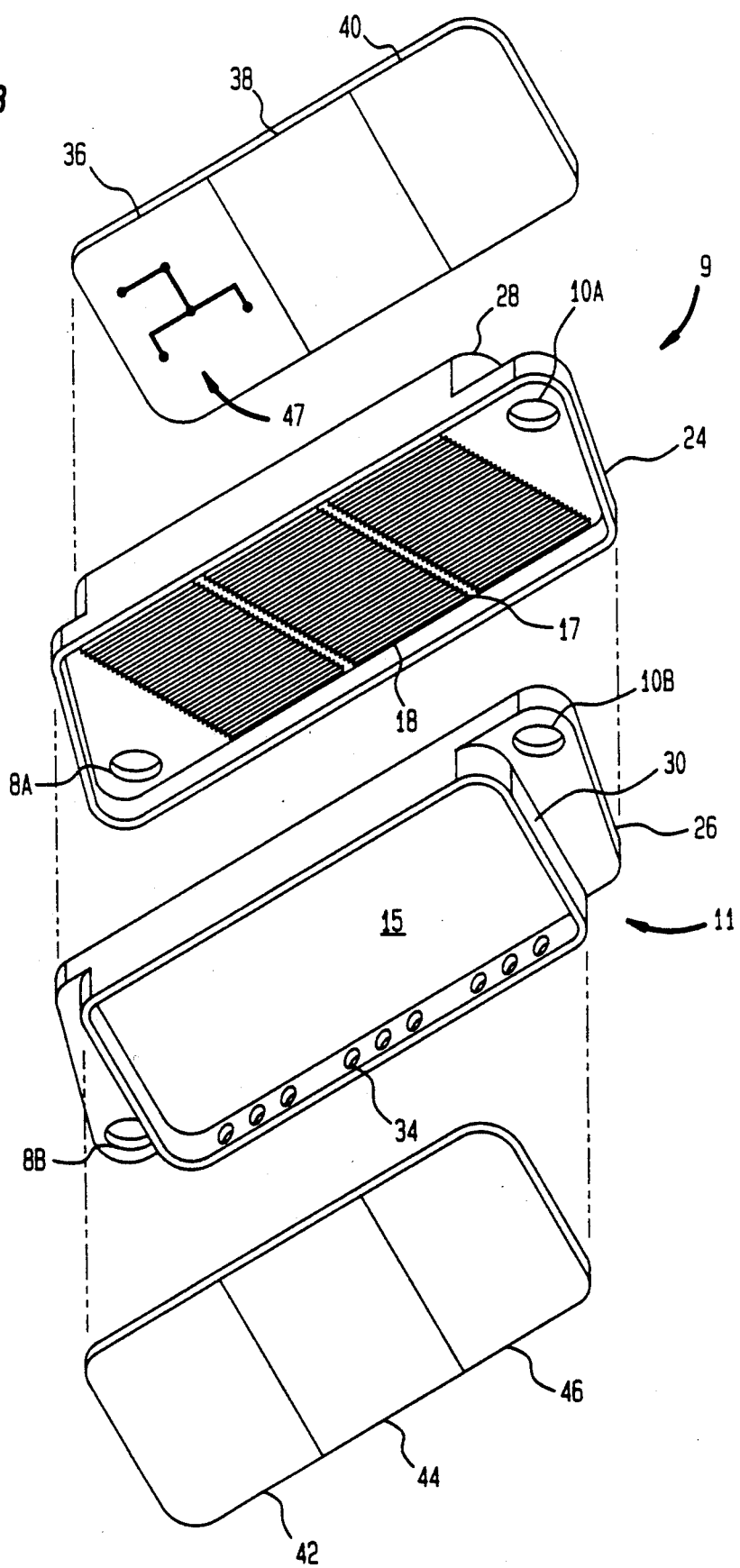
FIG. 3 is an exploded view illustrating the components of the invention and the assembled relationship thereof to each other.

With reference to FIG. 3, case side 9 includes a base 24 and a continuous wall 28 extending peripherally around said base 24 on one surface thereof, and case side 11 includes a base 26 and a continuous wall 30 extending peripherally around said base 26 on one surface thereof. The surfaces of bases 24 and 26 surrounded by walls 28 and 30, respectively, are effective as heat sinks 13 and 15 (FIG. 2) as will be hereinafter referred to.

Base side 9 includes longitudinally extending integral fins 18 on the surface thereof opposite wall 28 and base side 11 includes like extending integral fins 16 (shown in FIG. 2 but not otherwise shown in FIG. 3) on the surface thereof opposite wall 30. One side of wall 30 has holes such as 34 for accepting electrical feedthroughs from the circuitry enclosed in the package herein described. Fins 16 and 18 are transversely slotted via slots such as 17 for cooling fluid turbulence as particularly shown in FIG. 3 with relation to fins 18. Bases 24 and 26 carry holes 8A and 10A and 8B and 10B, respectively, which are aligned to provide ports 8 and 10 shown in FIG. 1.

With continued reference to FIG. 3, a plurality of members shown as three in number and designated by the numerals 36, 38 and 40 are suitably mounted to heat sink 13 (FIG. 2).

Figure 4:
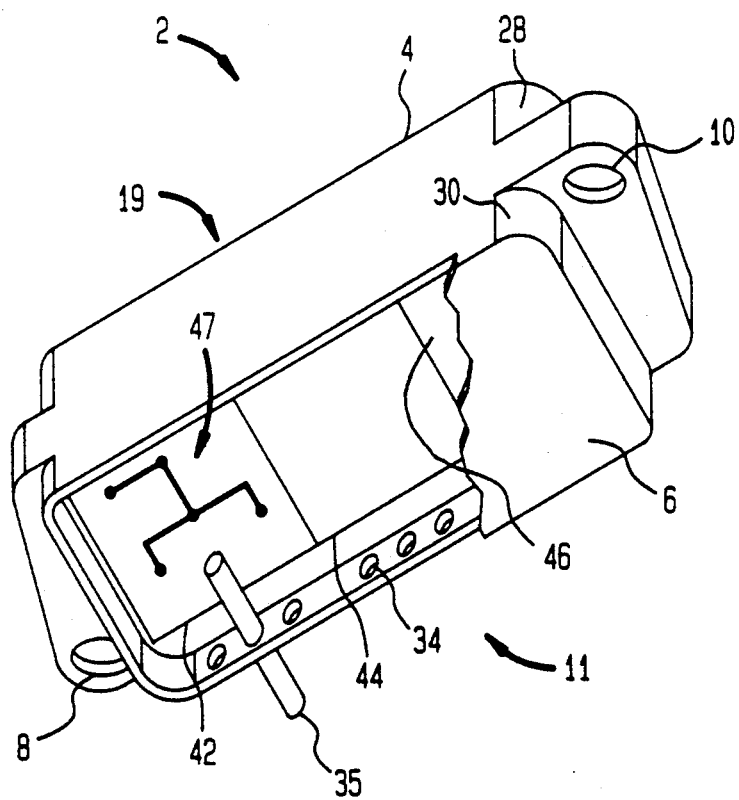
FIG. 4 is a perspective view further illustrating the features of the invention.

A like plurality of members designated by the numerals 42, 44 and 46 are likewise suitably mounted to heat sink 15 (FIGS. 3 and 4).

Members 36, 38, 40, 42, 44 and 46 are formed from a ceramic substrate with bonded metallic conductors mounted on both sides thereof. Power semiconductor circuits such as 47, which may include power semiconductor devices such as MOS-Controlled Thysistors (MCT's), are mounted on the metallic conductors so as to be conductively interconnected thereby. Case sides 9 and 11 are of a metal matrix composite (MMC) material.

In the disclosed form of the invention, walls 28 and 30 are of a suitable metallic alloy such as Kovar. Feedthroughs such as 35 (FIG. 4) accepted in feedthrough holes 34 and connected to circuitry such as 47 are likewise of Kovar and are isolated from wall 30 by, for example, a pressure bonded glass seal. The metallic conductors bonded to the plurality of substrates to provide members 36, 38, 40, 42, 44 and 46 are of copper, whereby said members are soldered to the respective heat sinks.

The assembled configuration of the invention is best illustrated in FIG. 4. Sides 9 and 11 are metallurgically joined to provide a unitary case 2 (FIGS. 1 and 2). Lids 4 and 6 which are of the metal matrix composite material are mounted to the extending edges of walls 28 and 30, respectively, as by welding, whereby a hermetically sealed package can be provided, as is well known in the art.

An important feature of the invention is that the metal matrix composite and ceramic substrate materials are selected so that their thermal coefficients of expansion (TCE's) are matched to provide a package suitable for the purposes intended. In this regard, the substrate material for components 36-46 is first selected and then the metal matrix composite material for case 2 and lids 4 and 6 is selected so that the respective TCE's match as closely as possible.

Thus, a suitable ceramic substrate for members 36-46 has been found to be, for example, beryllia (beryllium oxide). A suitable metal matrix composite (MMC) material for case 2 and lids 4 and 6 has been found to be, for example, an aluminum/ceramic composite, i.e. a silicon carbide reinforced aluminum marketed by Lanxide Electronics Corp. of Newark, Del. under their trade designation Primex TM. Other ceramics and MMC materials may be used as well, consistent with matching the respective TCE's as aforenoted.

It will be appreciated that the use of a metal matrix composite material as described enables more closely matched thermal coefficients of expansion, better thermal conductivity, lower density, wider flexibility in geometry, and lower manufacturing costs and strength comparable to steel than otherwise possible. With the arrangement described, an integral finned heat sink is provided without increasing the number of thermal interfaces as has heretofore been the case.

With the above description of the invention in mind, reference is made to the claims appended hereto for a definition of the scope of the invention.

What is claimed is:

1. A packaging arrangement for power semiconductor devices, comprising:

a unitary case having two sides, each of said sides having two opposite surfaces;

one of the two opposite surfaces of each of the two sides having a wall secured thereto and extending continuously and peripherally therearound, said wall defining a heat sink on said one surface;

the other of the opposite surfaces of each of the two sides including longitudinally extending integral cooling fins;

at least two slots extending transversely across the longitudinally extending integral cooling fins on the other of the opposite surfaces of each of the two sides for providing cooling fluid turbulence;

the two sides arranged so that the integral cooling fins on the other of the opposite surfaces of each of the two sides cooperate to provide an integral fin arrangement;

each of the heat sinks on the one of the two opposite surfaces of each of the two sides having mounted thereto a plurality of substrates with a conductor mounted to each of the substrates;

power semiconductor devices disposed on the conductors so as to be conductively interconnected through said conductors;

each of the two sides of the case closed by a lid for hermetically sealing the case; and a side of one of the walls on the one of the two opposite surfaces of one of the two sides having feedthrough holes for accepting feedthroughs connected to said power semiconductor devices.

2. An arrangement as described by claim 1, wherein:
   the case has a cooling fluid input port at one end of the integral fin arrangement and an output port at the other end of said integral fin arrangement, whereby a cooling fluid enters said one end through said input port, flows over said integral fin arrangement, and exits said other end through said output port.

3. An arrangement as described by claim 1, wherein:
   the two sides of the case and the lids closing said two sides are of a metal matrix composite material;
   the plurality of substrates are of a ceramic material; and
   the thermal coefficient of expansion of the metal matrix composite material matches that of the ceramic material.

4. An arrangement as described by claim 1, wherein:
   the wall secured to one of the two opposite surfaces of each of the two sides is of a metallic alloy material.

5. An arrangement as described by claim 1, wherein:
   the conductors are mounted to both sides of the substrates.

6. A method for packaging power semiconductor devices, comprising:

forming two sides of a unitary case so that each of said sides has two opposite surfaces;

forming one of said opposite surfaces of each of the two case sides with longitudinally extending integral cooling fins;

forming the longitudinally extending cooling fins with at least two transversely extending slots for providing cooling fluid turbulence;

securing a wall to the other of the two opposite surfaces of each of the two sides, said walls extending continuously and peripherally around said opposite surfaces so as to define a heat sink on each of said two sides;

mounting a plurality of substrates having conductors mounted thereto on the heat sink on each of the two sides;

disposing power semiconductor devices on the conductors for conductively interconnecting said semiconductor devices;

providing feedthrough holes in a side of one of the walls on the one of the two opposite surfaces of one of the two sides;

inserting feedthroughs in said holes and connecting the feedthroughs to the power semiconductor devices;

joining the two sides of the case at the one of their opposite surfaces for providing a cooling fin arrangement within the unitary case; and securing a lid to the wall on each of the other of the opposite surfaces of the two case sides for hermetically sealing the case.

7. A method as described by claim 6, including:
providing a cooling fluid intake port in said unitary case on one side of the cooling fin arrangement and providing a cooling fluid output port on the other side thereof for permitting a cooling fluid to flow through the inlet port, over the fin arrangement, and out the outlet port.

8. A method as described by claim 6, wherein:
forming the two sides of the case so that each of said two sides has two opposite surfaces and so that one of said opposite surfaces of each of the two case sides has integral fins includes forming said two case sides of a metal matrix composite material; and
joining the two sides of the case at the one of their opposite surfaces for providing an integral cooling fin arrangement within a unitary case includes metallurgically joining said two case sides.

9. A method as described by claim 8, wherein securing a wall to the other of the two opposite surfaces of each of the two sides, includes:
providing the walls of a metallic alloy material; and
soldering said metallic alloy material walls to the metal matrix composite material.

10. A method as described by claim 6, including:
providing the plurality of substrates of a ceramic material.

11. A method as described by claim 10, including:
providing the conductors of a metallic material; and
bonding the metallic material conductors to the substrates.

12. A method as described by claim 10, including:
matching the thermal coefficient of expansion of the metal matrix composite material with that of the ceramic material.

13. A method as described in claim 11, including:
bonding the conductors to both sides of the substrates.

* * * * *